(12) United States Patent
Belouet et al.

(10) Patent No.: US 8,506,704 B2
(45) Date of Patent: Aug. 13, 2013

(54) METHOD OF FABRICATING POLYCRYSTALLINE SILICON PLATES

(75) Inventors: Christian Belouet, Sceaux (FR); Claude Remy, Limonest (FR)

(73) Assignee: SOLARFORCE, Limonest (FR)

( * ) Notice: Subject to any disclaimer, the term of this patent is extended or adjusted under 35 U.S.C. 154(b) by 1484 days.

(21) Appl. No.: 10/594,652

(22) PCT Filed: Mar. 18, 2005

(86) PCT No.: PCT/FR2005/050175
§ 371 (c)(1),
(2), (4) Date: Sep. 27, 2006

(87) PCT Pub. No.: WO2005/101527
PCT Pub. Date: Oct. 27, 2005

(65) Prior Publication Data
US 2007/0193503 A1    Aug. 23, 2007

(30) Foreign Application Priority Data
Apr. 5, 2004 (FR) ...................... 04 50680

(51) Int. Cl.
*C30B 15/34* (2006.01)
(52) U.S. Cl.
USPC ................... 117/34; 117/13; 117/35; 117/36; 117/20
(58) Field of Classification Search
USPC ..................... 117/13, 20, 34, 35, 36
See application file for complete search history.

(56) References Cited

U.S. PATENT DOCUMENTS

| 5,248,621 A | * | 9/1993 | Sano | 438/64 |
| 5,306,646 A | | 4/1994 | Lauf | |
| 5,639,300 A | * | 6/1997 | Smith et al. | 117/37 |
| 6,043,427 A | | 3/2000 | Nishimoto | |
| 6,946,029 B2 | * | 9/2005 | Tsukuda et al. | 117/16 |

FOREIGN PATENT DOCUMENTS

| EP | 0079567 | 5/1983 |
| FR | 2386359 | 11/1978 |

OTHER PUBLICATIONS

International Search Report—Aug. 5, 2005.

* cited by examiner

*Primary Examiner* — Bob M Kunemund
(74) *Attorney, Agent, or Firm* — Sofer & Haroun, LLP

(57) ABSTRACT

The invention relates to a method of fabricating at least one polycrystalline silicon plate (68, 70) with one (64, 66) of its two faces presenting predetermined relief, in which method a layer of polycrystalline silicon (60, 62) is deposited on at least one (56, 58) of the two faces of a support (50). The method comprises the steps of embossing said face (52, 54) of the support (50) to impart thereto a shape that is complementary to said relief; depositing said polycrystalline silicon layer (60, 62) on said embossed face (56, 58) of the support (50), the surface (64 or 66) of said polycrystalline silicon layer situated in contact with said embossed face (56 or 58) then taking on the shape of said relief; and eliminating said support in order to obtain said polycrystalline silicon plate (68 or 70). The invention is applicable to fabricating solar cells.

36 Claims, 2 Drawing Sheets

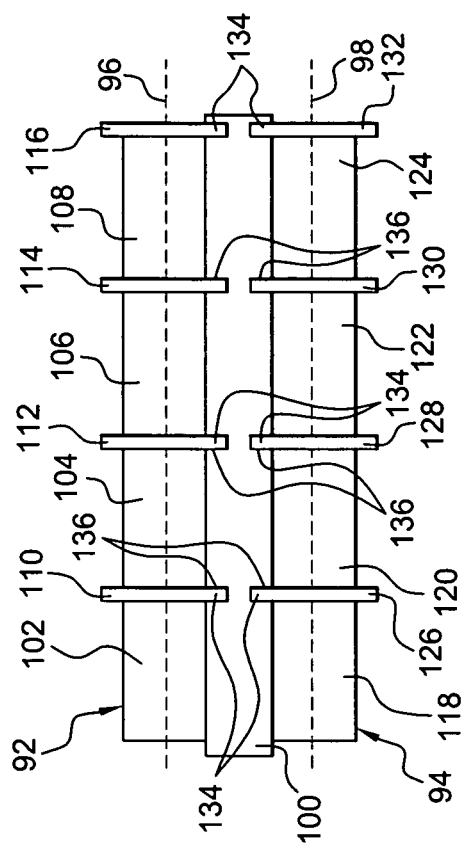
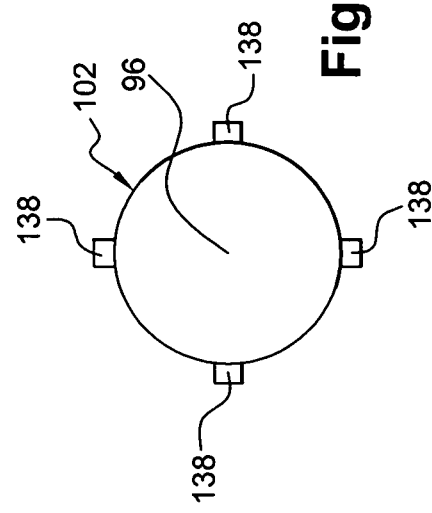
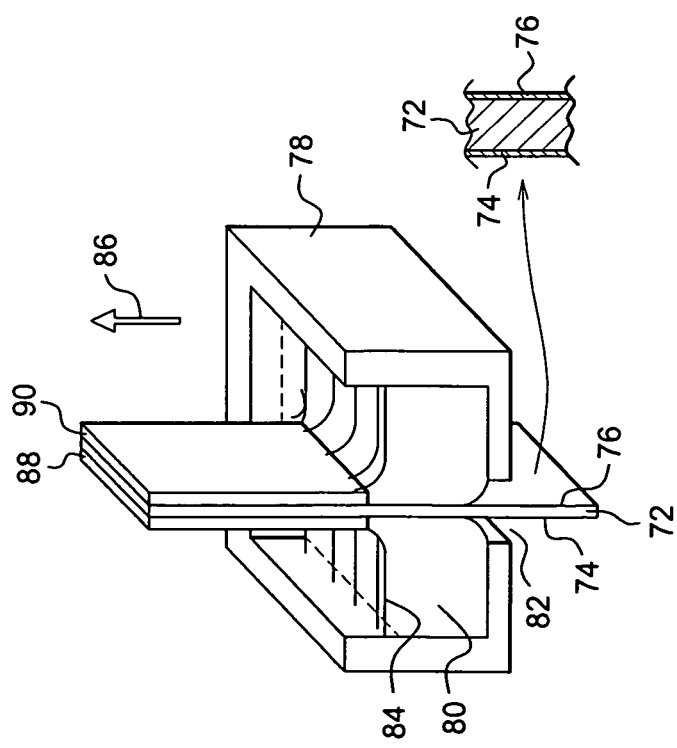

METHOD OF FABRICATING POLYCRYSTALLINE SILICON PLATES

RELATED APPLICATIONS

The present application is a national phase application of PCT/FR2005/050175, which in turn claims the benefit of priority from French Patent Application No. 04 50680, filed on Apr. 5, 2004, the entirety of which are incorporated herein by reference.

FIELD OF THE INVENTION

The present invention relates to a method of fabricating polycrystalline silicon plates, in particular plates of small thickness, with at least one of the two faces of each plate having predetermined relief.

BACKGROUND OF THE INVENTION

A typical photovoltaic cell is a diode with an n-p junction, the junction being very shallow and parallel to the surface. When illuminated, photons of energy hv greater than the forbidden bandwidth $E_g$ of the semiconductor are absorbed and create electron-hole pairs. The minority carriers as generated in this way (holes in the n zone and electrons in the p zone) are collected by the n-p junction. This results in a current $I_{ph}$, that flows from the n region towards the p region. Metal contacts are made on the surface of the n-type zone (emitter) and on the rear face of the p-type zone (base) in order to collect the current.

The market for photovoltaic electricity is dominated by photovoltaic cells of the n-p (or p-n) junction type made on crystallized silicon. It is always necessary to seek a maximum value for the density of the photocurrent generated under given illumination. This amounts to maximizing collection of minority carriers generated by the useful fraction of the incident radiation (photons of energy hv>$E_g$). Several techniques are used for this purpose. By way of example, mention can be made of: increasing the thickness of the base in order to enable long-wavelength photons close to infrared to be absorbed (but to the detriment of silicon consumption); reducing the depth of the junction in order to encourage the absorption, in the base, of short-wavelength photons, close to UV; depositing an anti-reflection layer on the illuminated face in order to improve collection of incident radiation; or indeed reducing recombination processes at the interfaces (front face, rear face, contacts).

A final technique is texturing the surface. This technique, e.g. described in the article by J. Nijs, J. Szlufcik, J. Poortmans et al., published in IEEE Trans. Electron Devices 46 (10) (1999) 1948, consists in forming surface relief, in other words in texturing the surface so as to form pyramids. FIG. 1 shows the principle on which this technique operates. The face 10 of the silicon layer 12 that receives light is made up of an array of quasi-identical and adjacent pyramids 14 (represented by triangles in section) having side faces forming an angle of about 45° relative to the bases of the pyramids. An incident light beam 16 normal to the surface gives rise firstly to a refracted beam 18 which is absorbed in the layer 12, and secondly to a reflected beam 20. The reflected beam strikes the adjacent pyramid and gives rise firstly to a reflected beam 22 going away from the silicon layer and is therefore lost, and secondly to a first refracted beam 24 followed by a second refracted beam 26 that is absorbed by the layer. The relief thus increases the overall efficiency of the photovoltaic cell. Specifically:

- the effective coefficient of reflection for light on the entry face is reduced, in particular when the incident light presents a large component of diffuse light; and
- the angle of inclination of light rays that propagate in the base relative to the macroscopic surface of the photovoltaic cell is greatly increased, which has two consequences: firstly there is an increase in propagation distance within the base of the semiconductor; and secondly there is an increase in the coefficient of reflection of light on the rear face of the semiconductor. These two effects increase the probability of long-wavelength photons being absorbed. Consequently, they contribute to increasing the density of the photocurrent and the open-circuit voltage of the solarcell compared with a solarcell in which the silicon layer has faces that are plane.

The presence of such texturing becomes very important for maintaining high conversion efficiencies when it is desired to reduce drastically the thickness of the silicon layer typically from around 300 micrometers (μm) or 350 μm (conventional photovoltaic cells), down to less than 100 μm, or down to 50 μm (or even less), in order to reduce the cost of such devices. In this range, and while the coefficient of reflection on the rear face is typically less than 0.6 (normal incidence on the rear face), a large fraction of the spectrum of the incident radiation propagating close to the normal at the surface is not absorbed in the thickness of the material unless special precautions are taken.

In a first known texturing technique, that applies only to single crystal silicon plates having their surface close to the (100) crystal plane, texturing is performing by chemically etching the surface using a solution of KOH and isopropanol. Such etching is highly anisotropic and specific to the (100) crystallographic face, and enables very regular pyramids of micrometer size that are inclined at 45° to be obtained on the macroscopic surface. However, that technique is much less effective when it is applied to plates of polycrystalline silicon, as are being used more and more for reasons of cost.

Under such circumstances, other techniques have been tried. Nevertheless, those techniques rely on isotropic etching, i.e. etching that is assumed to attack all grains under similar conditions: chemical or electrochemical etching using an acid medium (described in the article by V. Y. Yerokhov, R. Hezel, M. Lipinski, R. Ciach, H. Nagel, A. Mylyanych, P. Panek, Solar Energy Materials & Solar Cells 72 (2002) 291-298), reactive ion etching (RIE) in a gas, e.g. using a plasma containing chlorinated species (described in the article by S. Fujii, Y. Fukawa, H. Takahashi, Y. Inomata, K. Okada, K. Fukui, K. Shirasawa, Solar Energy Materials & Solar Cells 65 (2001) 269-275).

Another known technique relates to mechanical etching described in the article by F. Duerinckx, J. Szulfcik, J. Nijs, R. Mertens, C. Gerhards, C. Markmann, P. Fath, G. Willek, High efficiency, mechanically V. textured, screen printed multicrystalline silicon solar cells with silicon nitride passivation, Proceedings 2nd World Conference on PV Solar Energy Conversion, 1998. Mechanical etching consists in forming relief mechanically, e.g. an array of mutually parallel grooves or pyramids directly on the surface of the layer of silicon using mechanical tools such as a diamond grindwheel. Nevertheless, that operation considerably disturbs the structure of the silicon over a thickness of about 10 μm, thereby having the effect of inducing defects throughout the volume of the silicon following the heat treatments to which the silicon is subjected subsequently. In addition, mechanical etching is slow and expensive and therefore industrially ineffective.

Each of those techniques presents limitations that are severe, either in terms of cost (electrochemical etching, plasma etching, and mechanical etching), or in terms of effectiveness (acid chemical etching). Several of them are not applicable to plates that are very thin, of thickness smaller than 300 μm, which are generally very fragile, given the manipulations and/or the mechanical stresses they involve. That applies to mechanical etching and to some extent to electrochemical cleaning (manipulations). The method of the present invention does not present the above drawbacks.

OBJECTS AND SUMMARY OF THE INVENTION

One of the applications of the present invention lies in texturing polycrystalline silicon layers in order to fabricate solar cells, and it is particularly advantageous for layers of small thickness, less than 300 μm. Texturing consists in imparting predetermined relief to the surface of the layer, for example an array of parallel grooves or an array of pyramids.

Another application of the present invention relates to marking plates in order to enable a plate or a series of silicon plates to be distinguished from other silicon plates.

Another application of the present invention lies in reinforcing the stiffness of thin silicon plates.

In general, the present invention solves the problem of embossing polycrystalline silicon plates, in particular of small thickness, less than 300 μm, by proposing a method that is less expensive than prior art methods, and effective since it does not disturb the internal structure of the silicon, and since it can be implemented industrially.

More precisely, the invention provides a method of fabricating at least one polycrystalline silicon plate with one of its two faces presenting predetermined relief, in which method a layer of polycrystalline silicon is deposited on at least one of the two faces of a support, the method being characterized by the steps of:
  embossing said face of the support to impart thereto a shape that is complementary to said relief;
  depositing said polycrystalline silicon layer on said embossed face of the support, the surface of said polycrystalline silicon layer situated in contact with said embossed face then taking on the shape of said relief;
  cutting up said polycrystalline silicon layer; and
  eliminating said support in order to obtain said polycrystalline silicon plate.

The predetermined relief may perform one or more functions. For example it may serve to texture the face(s) of the silicon plate. Under such circumstances, the relief occupies at least the major portion of the face(s). In addition to, or independently of, texturing, the relief may serve to mark the silicon layer with a reference for distinguishing the plate, or a series of plates derived from the silicon layer, relative to other silicon plates. When the relief involves only a portion of the plate, it may also serve to increase the stiffness of thin silicon plates, which are themselves relatively flexible, by creating ribs.

Since the invention applies most particularly to fabricating solar cells, said relief can be selected in such a manner as to texture the major portion of the surface of the silicon layer so as to increase the probability of incident light being absorbed in said layer.

In a first variant implementation of the invention, said texturing relief is in the form of an array of substantially identical pyramids, the side faces of each of said pyramids preferably forming angles substantially equal to 45° relative to the base of the pyramid. The height of such a pyramid advantageously lies in the range 1 μm to 10 μm.

In another variant implementation, said support is a carbon tape covered in a protective coating of pyrolytic graphite before its surface is embossed to impart said complementary-shape relief thereto.

Said face of the support may be embossed to give it a shape that is complementary to said relief by pressing a die against said support, the embossing surface of the die having the shape of a plane surface with said predetermined relief embossed thereon.

In another variant implementation of the invention, said face of the support is embossed to give it a shape complementary to said relief by pinching said support between two rollers and running it through between them, with the embossing surface of at least one of said rollers presenting the shape of said predetermined relief.

Said embossing surface of said die or of said roller is preferably made of a material selected from: carbon, silicon carbide, silicon, and silicon nitride.

Advantageously, the embossing surfaces of both rollers have the shape of said relief, the two faces of said support then taking on the shape complementary to said relief on the support being pinched between and running through said rollers.

In another variant implementation, a polycrystalline silicon layer is deposited simultaneously and continuously on both faces of said tape by causing it to pass through a bath of molten silicon and by pulling it vertically upwards at constant speed so as to leave said bath, thereby obtaining two polycrystalline silicon layers, each having a surface with said relief.

Said support is preferably burnt off by heating the assembly constituted by the support and the polycrystalline silicon to a high temperature, and thereafter the face of the polycrystalline silicon having the shape of said relief is cleaned.

Advantageously, said support has thickness lying in the range 200 μm to 350 μm, preferably in the range 200 μm to 300 μm, the layer of polycrystalline silicon has thickness lying in the range 40 μm to 300 μm, and the thickness of said protective coating is substantially equal to 1 μm.

In another variant implementation, said relief is composed, independently of or in addition to, texturing, by a pattern characterizing said plate or a series of plates of silicon. By way of example, the pattern may be a bar code or a reference number.

In another variant implementation, independently of, or in addition to, texturing and/or the pattern characterizing the plate, notches are embossed in said face of said support so that ribs of shape complementary to the notches are formed on said surface of the silicon layer, thereby having the effect of increasing the stiffness of the silicon layer. The depth of said notches may be several tens of micrometers and the greatest width of said ribs may be a few millimeters at most.

In another variant implementation, each of said rollers is formed by at least two knurling wheels, each having a face forming an embossed face, the knurling wheels being separated by a disk having a portion projecting beyond the embossing faces of the wheels, the embossing surfaces of the rollers then being constituted by the embossing faces of the knurling wheels forming the texturing and/or the pattern in the layer of silicon, plus the projecting portion of the disk forming the relief in the form of a rib perpendicular to the axis of rotation of said roller. Advantageously, each of the rollers is made up of a succession of knurling wheels separated by disks, each of the disks having a portion that projects beyond the surfaces of the knurling wheels, the spacing between said disks constituting the pattern that characterizes said plate or said series of plates of polycrystalline silicon.

In a another variant implementation, said rollers or said knurling wheels have longitudinal strips parallel to the axes of rotation of said rollers or knurling wheels. These longitudinal strips can coexist with the projections constituted by said disks.

BRIEF DESCRIPTION OF THE DRAWINGS

Other advantages and characteristics of the invention appear in the following description of implementations given as non-limiting examples and described with reference to the accompanying drawings, in which:

FIG. 4 is a diagram showing the preferred implementation of the method of fabricating textured layers;

FIG. 5 is a diagram showing rollers made up of knurling wheels and disks enabling the surface of the silicon layer to be textured and/or marked and ribbed by means of a step of embossing the support; and FIG. 6 is a diagrammatic section view of a knurling wheel provided with longitudinal strips parallel to its axis of rotation.

DETAILED DESCRIPTION

In the method of the invention, one or more thin plates of polycrystalline silicon are fabricated mainly by depositing silicon in the form of a thin layer on one or both previously-embossed faces of a support. Since the silicon is deposited on the surface in relief of the support, the silicon matches the shape of the relief. In other words, the shape of the face of the layer of silicon that is in contact with the support is obtained by molding liquid silicon on the support. The relief of the face of the support is thus selected to be of a shape that is complementary to the shape that is to be given to the relief on the face of the thin layer.

Figure 2:
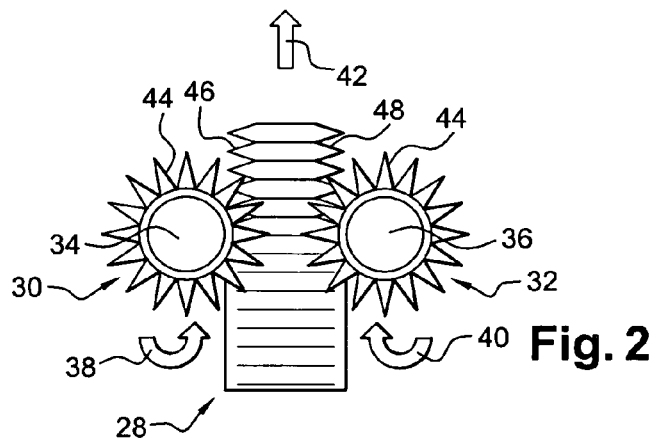
FIG. 2 is a diagram showing the method of texturing both faces of the silicon layer support.

FIGS. 2, 3, and 4 show the preferred embodiment of the invention in which two textured, marked, and/or ribbed layers of silicon are fabricated simultaneously by depositing the silicon on both faces of a support constituted by a tape. The first step of the method consists in giving both faces of the tape a shape that is complementary to the predetermined shape that is to be obtained for the faces of the two layers of silicon, i.e. the faces facing the support. This is shown in FIG. 2, where the tape 28 (shown in section) is pinched between two rollers 30 and 32. These rollers are cylindrical in shape and they revolve about their axes of rotation 34 and 36 respectively in the directions of arrows 38 and 40, thereby pulling the tape 28 upwards, in the direction of arrow 42. In another embodiment, the rollers 30 and 40 are mounted to turn freely about their axes of rotation 34 and 36, with the tape 28 being driven by other means independently of the rollers.

The embossing surfaces of these rollers, which are preferably made of carbon, silicon carbide, silicon, or silicon nitride, present the shape of the predetermined relief 44 that is to be given to the surface of the layer of silicon. The tape 28 is preferably made of carbon (laminated expanded graphite), a flexible material of small elasticity and low density (relative density lying in the range 0.6 to 1.3). By way of example, this carbon is as sold under the name "Papyex" by the supplier La Carbone Lorraine, "Sigraflex" by the supplier SGL Carbon, or "Grafoil" by the supplier Union Carbide. The relatively inelastic nature of these materials makes it possible to obtain an excellent molding of the relief 44 on the rollers on each of the surfaces 46 and 48 of the tape while the tape 28 is passing between the rollers 30 and 32. The approximate thickness of the tape 28 is 200 μm to 300 μm and it can be supplied in the form of rolls having a width of 1 meter (m) and a length of several hundreds of meters. Nevertheless, in the implementation described herein, it is preferable to use a width of about 15 centimeters (cm).

Figure 1:
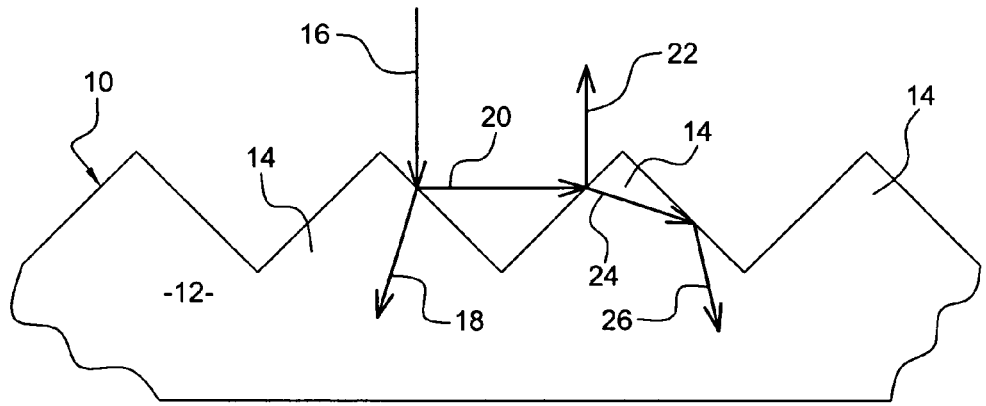
FIG. 1 shows the path of an incident light beam in a layer of silicon whose front surface has been textured to give it relief in the form of pyramids.

FIG. 2 is merely a diagrammatic view and represents relief 44 that may be in the form of an array of grooves that are parallel or perpendicular relative to the axes of rotation 34 and 36 of the rollers, when the objective is to texture the faces of the silicon layers. In the first configuration, the grooves are horizontal and extend across the width of the tape. In the second configuration, the grooves are vertical and extend lengthwise relative to the tape. In both configurations, an anisotropic array is obtained having one dimension. It should be observed that these two patterns applied to texturing the support tape give the same result from the point of view of texturing the silicon plate, as would be obtained by texturing the silicon directly in mechanical manner with a diamond, but without the drawbacks of that technique (slow, aggressive, and requiring finishing by deep chemical etching to eliminate the damage done by diamond etching). Preferably, the relief 44 may also be an array of adjacent pyramids as shown in FIG. 1. Whenever the application is for texturing the surface, the shape of the relief is selected so as to increase the probability of incident light being absorbed in the silicon layer.

Figures 3A, 3B, 3C, 3D:
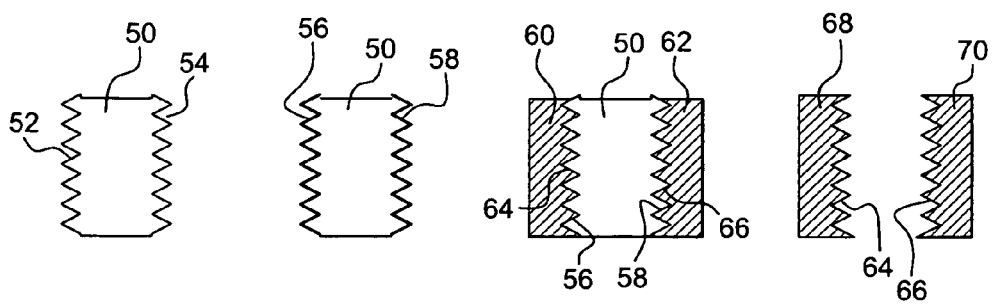
FIG. 3 shows the support and the silicon layers obtained at different steps of the method of fabricating textured silicon layers.

FIG. 3 shows the following steps in fabricating silicon layers. In FIG. 3A, there can be seen a carbon tape 50 with both of its faces 52 and 54 being textured by implementing the technique shown in FIG. 2. These two faces 52 and 54 are then covered (FIG. 3B) in a fine protective layer 56, 58 of pyrolytic graphite or pyrolytic carbon of micrometer thickness. Because of the very small thickness of this layer, the relief of the faces 52 and 54 is conserved. This protective coating is necessary because the carbon of the tape 50 reacts with molten silicon to give rise to silicon carbide, while pyrolytic graphite is inert relative to molten silicon.

FIG. 3C shows the resulting carbon tape of FIG. 3B with its faces in relief 56 and 58 having the two layers 60 and 62 of polycrystalline silicon deposited thereon. The preferred technique for depositing these layers is shown in FIG. 4. The tape serves simultaneously as a support for the silicon layers and as means for texturing, marking, and/or ribbing the faces 64 and 66 of the silicon layers that face the tape, thereby imparting the predetermined relief 44 of the rollers 30 and 32 (FIG. 2). The faces 64 and 66 of the silicon layers take on the shape of the respective embossed faces 56 and 58 as in a molding technique. This relief is complementary in shape to the shape of the faces 56 and 58 of the support tape 50; it is therefore identical to shape to the relief 44 on the rollers 30 and 32 of FIG. 2. The layers of silicon are thus given the desired predetermined shape in relief.

The following step consists initially in cutting up the composite tape made of the tape 50 plus the silicon layers 60 and 62 into plates, generally of rectangular shape. Then the support tape 50 is eliminated (FIG. 3D) by being burnt off in air at high temperature (about 1000° C.) in order to obtain two plates 68 and 70 of polycrystalline silicon. Thereafter, the textured faces of the plates are subjected to light cleaning in order to eliminate the oxidized layers of silica that form on their surfaces. These oxidized layers are of very small thickness, of the order of a few tenths of a micrometer. Cleaning can be performed using various conventional techniques, e.g. using gaseous hydrofluoric acid, a 5% aqueous solution of hydrofluoric acid in water, possibly having 10% nitric acid added to, or indeed by reactive ion etching (RIE) in a gas, e.g. by means of a plasma containing chlorinated species.

The silicon layers 60 and 62 are advantageously deposited on the support tape 50 using the method shown in FIG. 4. This method, referred to as the silicon tape on temporary carbon substrate (TTS) method, is described in several patents, for example: FR 2 386 359, FR 2 550 965, or FR 2 568 490. Nevertheless, the method described in those patents does not make use of an embossed carbon tape for the tape 50. The layers of silicon fabricated in accordance with the teaching of those patents are therefore not embossed (e.g. textured, marked, and/or ribbed). In FIG. 4, the faces 74 and 76 of a flexible carbon tape 72 (identical to the tape 50 in FIG. 3) are embossed (FIG. 3A) so as to take the shape that is complementary to the predetermined relief by performing the method shown in FIG. 2 and then being covered in a protective layer of pyrolytic graphite (FIG. 3B). A silica or carbon crucible 78 contains a bath 80 of molten silicon together with means (not shown) for heating the silicon, e.g. heater resistance surrounding the crucible. The bottom of the crucible 78 includes a rectilinear slot 82 through which the carbon tape 72 passes vertically. The tape is set into vertical upward movement by means that are not shown, and it leaves the bath 80 by passing through its horizontal equilibrium surface 84. The width and the length of the slot 82 are determined so that the liquid silicon meniscus in this slot from a connection that is stable.

When the tape 72 moves in the direction of arrow 86, a polycrystalline silicon layer 88 or 90 is deposited on the respective embossed faces 74 and 76 of the support tape 72. This produces the equivalent of the carbon tape 50 and the layers 60 and 62 of FIG. 3C. The assembly comprising the support tape plus the silicon layers is then cut up to form plates. Thereafter, the support tape 72 is eliminated and the two resulting layers of polycrystalline silicon are treated as described above with reference to FIG. 3D.

The method described with reference to FIG. 2 is implemented using two rollers 30 and 32 whose embossing surfaces carry relief in the form of pyramids, enabling the silicon layer to be textured. FIG. 5 is a diagram showing an embodiment of rollers suitable for texturing and/or marking and ribbing the layer of silicon. Two facing rollers 92 and 94 revolve about respective parallel axes of rotation 96 and 98. A carbon tape 100 (shown in section perpendicularly to its length) that is to act as a support for the layers of polycrystalline silicon is pinched between the rollers 92 and 94 and travels between the rollers in a direction perpendicular to the sheet of the drawing. The roller 92 is made up of a series of knurling wheels 102, 104, 106, and 108 that are separated by disks 110, 112, 114, and 116. These knurling wheels and disks have a common axis of rotation 96. Similarly, the roller 94 is made up of knurling wheels 118, 120, 122, and 124 separated by disks 126, 128, 130, and 132, the knurling wheels and disks having the axis 98 as their axis of rotation. The cylindrical surface (embossing surface) of each of the knurling wheels may have an embossing pattern or relief suitable for texturing and/or marking a reference on the carbon tape 100. The disks are of a diameter that is slightly greater than the diameter of the knurling wheels such that a portion 134 of each disk (its outer circumference) projects from the embossing surfaces of the knurling wheels. As a result, the relief embossed in the tape 100 by the disks 110 to 116 and 126 to 132 is in the form of grooves 136. By depositing the layer of silicon on the tape, e.g. using the method shown in FIG. 4, the surface of the layer of silicon will include ribs of shape complementary to the grooves 136 and extending longitudinally relative to the tape 100. These ribs reinforce the stiffness of the silicon layer.

Grooves can also be formed across the width of the tape. To do this, the knurling wheels carry relief in the form of ribs located on their embossing surfaces. This is shown diagrammatically in FIG. 6 where the knurling wheel 102 is shown in section perpendicularly to its axis of rotation 96. Ribs 138 are placed on the cylindrical embossing surface of this knurling wheel parallel to the axis of rotation 96. These ribs form grooves of complementary shape in the support tape 100 and thus ribs of the same shape on the layer of silicon. Such ribs 138 can be located in the same manner on the embossing surfaces of all the other knurling wheels, or on a fraction only thereof, depending on the relief that is desired on the silicon layer. The number and spacing of the ribs 138 can be varied.

By combining the disks of FIG. 5 with the ribs of FIG. 6, relief is obtained that is waffle-shaped, being constituted by a grid of ribs, some being in the length direction of the tape and the others being in the width direction. Under such circumstances, it is preferable for the ribs not to come directly into contact with the disks, but to be spaced apart therefrom by gaps of the order of 1 millimeter (mm) or less.

The greatest width of the ribs is preferably no more than 1 mm and their height is preferably a few tens of micrometers.

The section of the ribs may be of any shape that is appropriate for the intended purpose (e.g. reinforcing the stiffness of the silicon layer), e.g. they can be U-shaped or V-shaped.

The method of the invention provides an industrial solution to embossing polycrystalline silicon plates, such as texturing them, marking them, and/or reinforcing their stiffness, without there being any mechanical or chemical stress being applied to the plate. The internal structure of the silicon is therefore not damaged. When the predetermined relief is in the form of an array of substantially identical pyramid, the resulting texturing is completely isotropic and it is possible to modulate the period of the array of pyramids and the shape of the pyramid. The method can be implemented at low cost, the greatest cost involved lying in fabricating the rollers 30 and 32 or 92 and 94, which can be used in fabricating very many plates. The texturing that is obtained can be considerable (high density and/or intensity of the relief) thus enabling photovoltaic cells to be fabricated that present very good efficiency in converting light into electron-hole pairs. In addition, consumption of chemicals is very small, since chemicals are used only for eliminating the layer of silica that forms while eliminating the carbon support tape by heating it.

In the preferred implementation of the invention described above, both faces of the carbon support tape are textured and two textured layers of polycrystalline silicon are fabricated simultaneously. Naturally, it is possible to texture only one face of the support tape (by texturing only one of the two rollers 30 and 32), thereby obtaining only one textured silicon layer, without that going beyond the ambit of the present invention. Similarly, a method other than that shown in FIG. 4 could be used for depositing a layer of silicon on a support. Instead of using rollers for embossing the support tape, it is possible to use a die having a plane surface that is embossed with the predetermined relief.

The invention claimed is:
1. A method of fabricating at least one polycrystalline silicon plate with one of its two faces presenting predetermined relief, said method comprising the steps of:

embossing a face of a carbon tape support by pressing a die against said carbon tape support to impart thereto a surface relief complimentary to said predetermined relief of said at least one polycrystalline silicon plate;

depositing a polycrystalline silicon layer on said surface relief on said face of the carbon tape support, with at least one surface of said polycrystalline silicon layer against said surface relief of said face of said carbon tape support, with said surface of said polycrystalline silicon layer having substantially the same shape as the shape of said surface relief;

cutting up said polycrystalline silicon layer; and eliminating said support in order to obtain said polycrystalline silicon plate.

2. The method as claimed in claim 1, wherein said method further includes the step of, prior to depositing said polycrystalline silicon layer, a protective coating, inert to molten silicon is applied to said surface relief of said carbon tape support.

3. A method according to claim 2, wherein said protective coating is of pyrolytic graphite.

4. A method according to claim 1, wherein said surface relief of said carbon tape support is embossed by being pinched between two rollers and by causing said support to run between the rollers, the embossing surface of at least one of said rollers having the shape of said predetermined relief.

5. A method according to claim 1, wherein said die has the shape of a plane surface on which said predetermined relief has been embossed.

6. A method according to claim 4, wherein said surface of said roller or of said die is made of a material selected from the group consisting of carbon; silicon carbide; silicon; and silicon nitride.

7. A method according to claim 4, wherein the embossing surfaces of the two rollers have the shape of said relief, both faces of said carbon tape support then taking on the shape complementary to said relief during said pinching and running between said rollers.

8. A method according to claim 3, wherein a polycrystalline silicon layer is deposited simultaneously and continuously on both of the faces of said carbon tape support by causing it to pass through a bath of molten silicon and by pulling it vertically upwards at constant speed so as to exit said bath, thereby obtaining two layers of polycrystalline silicon, each having a surface with said relief.

9. A method according to claim 1, wherein said carbon tape support is eliminated by being burnt off by heating the assembly of the support and the polycrystalline silicon to high temperature.

10. A method according to claim 9, wherein the face of the polycrystalline silicon that has the shape of said relief is cleaned after said carbon tape support has been burnt off.

11. A method according to claim 1, wherein said carbon tape support presents a thickness lying in the range 200 µm to 350 µm.

12. A method according to claim 1, wherein the thickness of the polycrystalline silicon layer lies in the range 40 µm to 300 µm.

13. A method according to claim 3, wherein the thickness of said protective coating is substantially equal to 1 µm.

14. A method according to claim 1, wherein said face of said carbon tape support is embossed in such a manner as to texture said face of said polycrystalline silicon layer, said relief being selected in such a manner as to increase the probability of incident light being absorbed in said layer.

15. A method according to claim 14, wherein said relief is in the form of an array of substantially identical pyramids.

16. A method according to claim 15, wherein the side faces of each of said pyramids form angles that are substantially equal to 45° with the base of the pyramid.

17. A method according to claim 15, wherein said pyramids are of a height lying in the range 1 µm to 10 µm.

18. A method according to claim 1, wherein said face of said carbon tape support is embossed in such a manner that said surface of said silicon layer is marked with a pattern resembling said plate or a series of polycrystalline silicon plates.

19. A method according to claim 18, wherein said pattern is a bar code.

20. A method according to claim 18, wherein said polycrystalline in that said pattern is a number.

21. A method according to claim 14 wherein said relief is formed by texturing said face of said polycrystalline silicon layer and by said pattern resembling said plate.

22. A method according to claim 1, wherein said grooves are embossed in said face of said carbon tape support in such a manner that ribs of shape complementary to the grooves are formed on said surface of the silicon layer, thereby increasing the stiffness of said layer.

23. A method according to claim 22, wherein said grooves are of a depth of a few tens of micrometers.

24. A method according to claim 22, wherein the greatest width of said ribs is no more than a few millimeters.

25. A method according to claim 22, wherein said ribs extend in the length direction of said tape.

26. A method according to claim 22, wherein said ribs extend in the width direction of said tape.

27. A method according to claim 25, wherein said relief is waffle-shaped, having a grid of ribs in the length direction and in the width direction of said carbon tape support.

28. A method according to claim 7, wherein each of said rollers is made up of at least two knurling wheels each having a face forming an embossing face, said knurling wheels being separated from one another by disks each having a portion projecting beyond the embossing faces of said knurling wheels, said embossing surfaces of the rollers being formed by said embossing faces of said knurling wheels forming the texturing and/or the marking of said silicon layer, and said projecting portions of said disk forming grooves in the carbon support tape and forming said relief in the shape of ribs on the layers of silicon.

29. A method according to claim 18, wherein each of said rollers is made up of a succession of knurling wheels separated from one another by disks, each of said disks having a portion projecting beyond the surfaces of said knurling wheels to create grooves in the carbon support tape, the spacing between said grooves forming said pattern resembling said plate or said series of polycrystalline silicon plates.

30. A method according to claim 7, wherein each of said rollers is made up of at least two knurling wheels revolving about an axis of rotation, each having a face forming an embossing face, at least one of said knurling wheels including longitudinal ribs parallel to said axis of rotation.

31. A method according to claim 11, wherein said carbon tape support presents a thickness lying in the range of 200 µm to 300 µm.

32. The method as claimed in claim 1, wherein said embossing step further includes simultaneously embossing two opposing faces of a carbon tape support, imparting thereto surface reliefs on both sides, complimentary to said intended predetermined relief of said silicone plate.

33. The method as claimed in claim 32, wherein said depositing step includes simultaneously depositing polycrystalline silicon layers on both of said embossed faces of said carbon tape support.

34. The method as claimed in claim 33, wherein said step of eliminating said support includes eliminating said support from between two polycrystalline silicon layers on both of said embossed faces of said carbon tape support in order to obtain two of said polycrystalline silicon plates.

35. The method as claimed in claim 1, wherein said surface of said polycrystalline silicon layer has an identical shape as the shape of said surface relief.

36. A method of fabricating at least one polycrystalline silicon plate with one of its two faces presenting predetermined relief, said method comprising the steps of:
- embossing a face of a carbon tape support by pinching said carbon tape support between two rollers and running said carbon tape support between them to impart thereto a surface relief complimentary to said predetermined relief of said at least one polycrystalline silicon plate;
- depositing a polycrystalline silicon layer on said surface relief on said face of the carbon tape support, with at least one surface of said polycrystalline silicon layer against said surface relief of said face of said carbon tape support, with said surface of said polycrystalline silicon layer having substantially the same shape as the shape of said surface relief
- cutting up said polycrystalline silicon layer; and
- eliminating said support in order to obtain said polycrystalline silicon plate.

* * * * *